United States Patent
Zhao et al.

(10) Patent No.: US 11,347,360 B2
(45) Date of Patent: May 31, 2022

(54) TOUCH DISPLAY SUBSTRATE AND METHOD FOR DRIVING THE SAME, DISPLAY DEVICE

(71) Applicant: BOE TECHNOLOGY GROUP CO., LTD., Beijing (CN)

(72) Inventors: Detao Zhao, Beijing (CN); Ming Yang, Beijing (CN); Han Yue, Beijing (CN); Dongni Liu, Beijing (CN); Li Xiao, Beijing (CN); Lei Wang, Beijing (CN); Minghua Xuan, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 270 days.

(21) Appl. No.: 16/606,385

(22) PCT Filed: Mar. 11, 2019

(86) PCT No.: PCT/CN2019/077644
§ 371 (c)(1),
(2) Date: Oct. 18, 2019

(87) PCT Pub. No.: WO2019/228018
PCT Pub. Date: Dec. 5, 2019

(65) Prior Publication Data
US 2021/0342035 A1    Nov. 4, 2021

(30) Foreign Application Priority Data

May 31, 2018    (CN) .......................... 201810551140.6

(51) Int. Cl.
*G06F 3/041*    (2006.01)
*G06F 3/044*    (2006.01)
*G09G 3/3241*    (2016.01)

(52) U.S. Cl.
CPC .......... *G06F 3/0446* (2019.05); *G06F 3/0445* (2019.05); *G09G 3/3241* (2013.01); *G06F 2203/04102* (2013.01)

(58) Field of Classification Search
None
See application file for complete search history.

(56) References Cited

U.S. PATENT DOCUMENTS 9,927,918 B2    3/2018    Huang et al.
10,013,105 B2    7/2018    Yang et al.
(Continued)

FOREIGN PATENT DOCUMENTS

CN    101320185 A    12/2008
CN    104777933 A    7/2015
(Continued)

OTHER PUBLICATIONS

Office Action dated Jan. 3, 2020 issued in corresponding Chinese Application No. 201810551140.6.

*Primary Examiner* — Carl Adams
(74) *Attorney, Agent, or Firm* — Nath, Goldberg & Meyer; Joshua B. Goldberg

(57) ABSTRACT

A touch display substrate, including touch electrodes, touch lines and sub-pixels, each sub-pixel includes a storage capacitor, a driving transistor, a switching element and a light emitting element, a first electrode and a second electrode of the storage capacitor are coupled to a gate electrode and a first electrode of the driving transistor, respectively, and a second electrode of the driving transistor, the switching element and the light emitting element are sequentially coupled in series, each touch electrode is coupled to one corresponding touch line through a via hole in an insulating layer between said each touch electrode and the corresponding touch line, and each touch electrode is formed by the second electrode of the storage capacitor in at least one
(Continued)

sub-pixel, during a touch stage, the switching element decouples electrical coupling between the second electrode of the driving transistor and the light emitting element.

18 Claims, 4 Drawing Sheets

(56) References Cited

U.S. PATENT DOCUMENTS

| | | | |
|---|---|---|---|
| 10,394,354 | B2 | 8/2019 | Lu et al. |
| 2010/0013789 | A1 | 1/2010 | Chung et al. |
| 2016/0216800 | A1* | 7/2016 | Cho .................... G09G 3/3291 |
| 2018/0113559 | A1* | 4/2018 | Bae .................... G06F 3/04166 |
| 2018/0143717 | A1* | 5/2018 | An ....................... G06F 3/0445 |

FOREIGN PATENT DOCUMENTS

| | | |
|---|---|---|
| CN | 105093722 A | 11/2015 |
| CN | 106201072 A | 12/2016 |
| CN | 106354339 A | 1/2017 |
| CN | 207165217 U | 3/2018 |
| EP | 3301552 A1 | 4/2018 |

\* cited by examiner

TOUCH DISPLAY SUBSTRATE AND METHOD FOR DRIVING THE SAME, DISPLAY DEVICE

CROSS-REFERENCE TO RELATED APPLICATIONS

This is a National Phase Application filed under 35 U.S.C. 371 as a national stage of PCT/CN2019/077644, filed Mar. 11, 2019, an application claiming the benefit of Chinese Patent Application No. 201810551140.6, filed on May 31, 2018, the contents of each of which are incorporated herein in their entirety by reference.

TECHNICAL FIELD

The present disclosure relates to a touch display substrate, a method for driving the touch display substrate and a display device.

BACKGROUND

In an organic light emitting diode (OLED) touch display substrate, a cathode of an OLED is generally divided into a plurality of independent blocks, each block corresponds to a plurality of sub-pixels, and each block may be formed as a touch electrode and coupled to a driving chip through a touch line. The cathode of the organic light emitting diode is generally farther away from a base substrate than a light emitting layer of the organic light emitting diode, and it is difficult to form a via hole and the like in the light emitting layer of the organic light emitting diode, thus the touch line is generally disposed in a same layer as the touch electrode. However, the touch line and the touch electrode cannot be overlapped, therefore, an area occupied by the touch electrode is small, and a large touch blind area exists. Moreover, the cathode of the organic light emitting diode is generally made of a transparent conductive material such as indium tin oxide (ITO), and has a poor conductivity, thus the cathode of the organic light emitting diode being used as the touch electrode may result in a large loss of touch signal and a limited size of product, for example, the product may be a watch screen with a small size.

SUMMARY

An embodiment of the present disclosure provides a touch display substrate including a plurality of sub-pixels, each of the sub-pixels includes a storage capacitor, a driving transistor, a switching element and a light emitting element, a first electrode of the storage capacitor is coupled to a gate electrode of the driving transistor, a second electrode of the storage capacitor is opposite to the first electrode of the storage capacitor and is coupled to a first electrode of the driving transistor, a second electrode of the driving transistor, the switching element and the light emitting element are sequentially coupled in series, the touch display substrate is also provided with a plurality of touch electrodes which are mutually insulated and a plurality of touch lines, which are mutually insulated, respectively coupled to the touch electrodes, an insulating layer is provided between each of the touch electrodes and a corresponding one of the touch lines, each of the touch electrodes is coupled to the corresponding one of the touch lines through a via hole in the insulating layer, and each of the touch electrodes is formed by the second electrode of the storage capacitor in at least one of the sub-pixels, during a touch stage, the switching element is configured to decouple an electrical coupling between the second electrode of the driving transistor and the light emitting element.

In some implementations, the touch electrode is formed by electrically coupling second electrodes of storage capacitors in multiple adjacent sub-pixels.

In some implementations, the touch lines extend along a column direction, the touch electrodes are arranged in an array, each of the touch electrodes is formed by electrically coupling second electrodes of storage capacitors in m rows and n columns of sub-pixels, m and n are integers greater than or equal to 2, in each of the touch electrodes, the second electrodes of the storage capacitors of the sub-pixels in a same row are coupled into a whole to form a sub-electrode strip, and sub-electrode strips in different rows are coupled to a same one of the touch lines.

In some implementations, in each of the touch electrodes, a portion of the sub-pixels are used as coupling sub-pixels, the second electrodes of the storage capacitors in the portion of the sub-pixels are coupled to the corresponding one of the touch lines, one of the sub-pixels in each row is used as the coupling sub-pixel, the coupling sub-pixels in different rows are located in a same column, and the coupling sub-pixels in any two of the touch electrodes in a same column are located in different columns.

In some implementations, the touch display substrate is a flexible touch display substrate.

In some implementations, the touch display substrate further includes: a base substrate, the storage capacitor, the touch lines and the light emitting element are all arranged on the base substrate, and the light emitting element and the touch lines are arranged on a side, distal from the base substrate, of the storage capacitor.

In some implementations, the touch display substrate is a top emission touch display substrate.

In some implementations, the first electrode of the storage capacitor is arranged between the second electrode of the storage capacitor and the base substrate, the first electrode and the second electrode of the storage capacitor are coupled through a control transistor, and a gate electrode of the control transistor is electrically coupled to a control line.

In some implementations, the second electrode of the storage capacitor is disposed between the first electrode of the storage capacitor and the base substrate.

In some implementations, the light emitting element is an organic light emitting diode, and the organic light emitting diode includes a first electrode, a light emitting layer, and a second electrode which are arranged in sequence along a direction away from the base substrate, and the touch display substrate is further provided with a plurality of auxiliary touch electrodes which are mutually insulated and a plurality of auxiliary touch lines which are mutually insulated, each of the auxiliary touch electrodes is formed by coupling second electrodes of organic light emitting diodes in multiple adjacent ones of the sub-pixel into a whole, and each of the auxiliary touch electrodes is coupled to a corresponding one of the auxiliary touch lines.

In some implementations, the auxiliary touch electrode and the auxiliary touch lines are arranged in a same layer.

In some implementations, the first electrode of the organic light emitting diode is an anode, and the second electrode of the organic light emitting diode is a cathode.

In some implementations, the touch electrodes and the touch lines are made of metal material.

An embodiment of the present disclosure further provides a display device including the touch display substrate as above.

An embodiment of the present disclosure further provides a method for driving the touch display substrate as above, the touch display substrate includes a storage capacitor, a driving transistor, a switching element and a light emitting element, a first electrode of the storage capacitor is coupled to a gate electrode of the driving transistor, a second electrode of the storage capacitor is opposite to the first electrode of the storage capacitor and is coupled to a first electrode of the driving transistor, and a second electrode of the driving transistor, the switching element and the light emitting element are sequentially coupled in series, the touch display substrate is further provided with a plurality of touch electrodes which are mutually insulated and a plurality of touch lines, which are mutually insulated, respectively coupled to the touch electrodes, an insulating layer is provided between each of the touch electrodes and a corresponding one of the touch lines, each of the touch electrodes is coupled to the corresponding one of the touch lines through a via hole in the insulating layer, each of the touch electrodes is formed by the second electrode of the storage capacitor in at least one sub-pixel, the method includes: during a display stage, providing a first voltage signal to each of the touch lines for display; during a touch stage, providing a first touch signal to each of the touch lines, and receiving a first feedback signal fed back by each of the touch lines, wherein during the touch stage, the switching element is controlled to decouple an electric coupling between the second electrode of the driving transistor and the light emitting element.

In some implementations, each of the touch electrodes is formed by electrically coupling second electrodes of storage capacitors in multiple adjacent sub-pixels, each of the storage capacitors is arranged on a base substrate, the first electrode of each of the storage capacitors is arranged closer to the base substrate than the second electrode of each of the storage capacitors, the first electrode and the second electrode of each of the storage capacitors are coupled through a control transistor, and a gate electrode of the control transistor is coupled to a control line, and the method includes: during the display stage, providing a turn-off signal to the control line to control the control transistor to be turned off; during the touch stage, providing a turn-on signal to the control line to control the control transistor to be turned on.

In some implementations, the light emitting element is an organic light emitting diode, the touch display substrate further includes a plurality of auxiliary touch electrodes which are mutually insulated and a plurality of auxiliary touch lines which are mutually insulated, each of the auxiliary touch electrodes is formed by coupling second electrodes of organic light emitting diodes in multiple adjacent sub-pixels, and each of the auxiliary touch electrodes is coupled to a corresponding one of the auxiliary touch lines, and the method further includes: during the display stage, providing a second voltage signal to each of the auxiliary touch lines for display; during the touch stage, providing a second touch signal to each of the auxiliary touch lines, and receiving a second feedback signal fed back by each of the auxiliary touch lines.

In some implementations, the first touch signal and the second touch signal are provided simultaneously.

In some implementations, the first touch signal is synchronous with the second touch signal.

In some implementations, each of the touch electrodes is formed by electrically coupling second electrodes of storage capacitors in multiple adjacent sub-pixels, the light emitting element is an organic light emitting diode, the organic light emitting diode includes a first electrode, a light emitting layer, and a second electrode which are sequentially arranged, and the second electrode of the storage capacitor is coupled to the first electrode of the organic light emitting diode through the first electrode of the driving transistor, and the method includes: during the touch stage, simultaneously providing the first touch signal to each of the touch lines and a synchronous auxiliary signal to the second electrode of the organic light emitting diode.

DESCRIPTION OF EMBODIMENTS

In order to make a person skilled in the art understand technical solutions of the present disclosure better, the present disclosure will be described in detail below in conjunction with accompanying drawings and specific embodiments.

In the present disclosure, two structures being "in a same layer" means that they are formed from a same material layer and thus are in a same layer in a stacked relationship, which does not represent that they are equidistant from a base substrate, nor that other layer structures are identical between each of them and the base substrate.

It should be understood that although following embodiments have been described by taking a light emitting element being an organic light emitting diode as an example, the present disclosure is not limited thereto, and the light emitting element may be of any other type as necessary.

Figure 1:
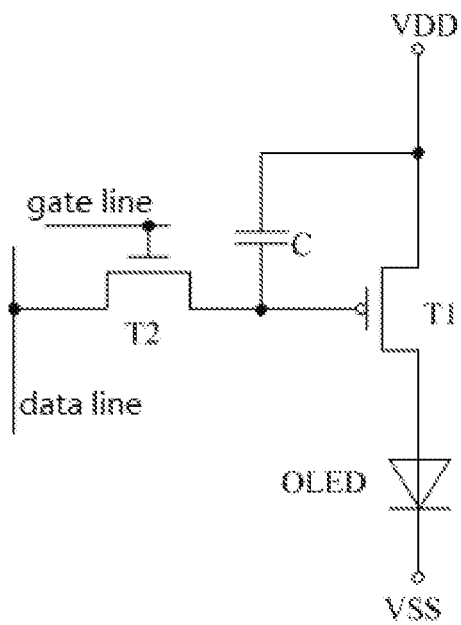
FIG. 1 is a circuit diagram of a pixel circuit.
Figure 2:
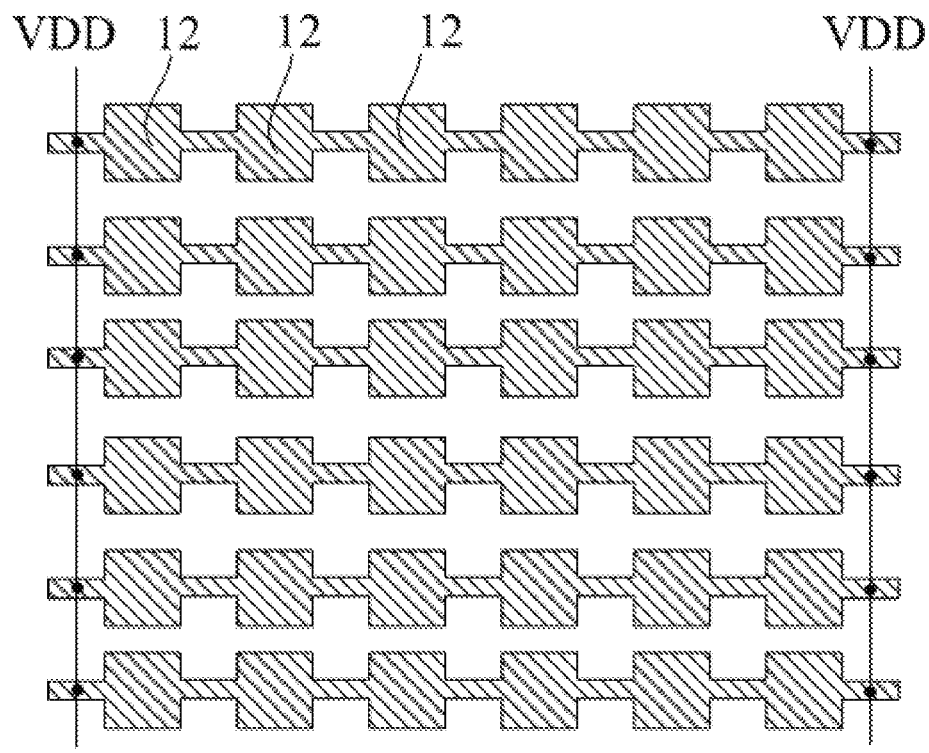
FIG. 2 is a schematic top view of a second electrode of a storage capacitor in a touch display substrate.
Figure 4:
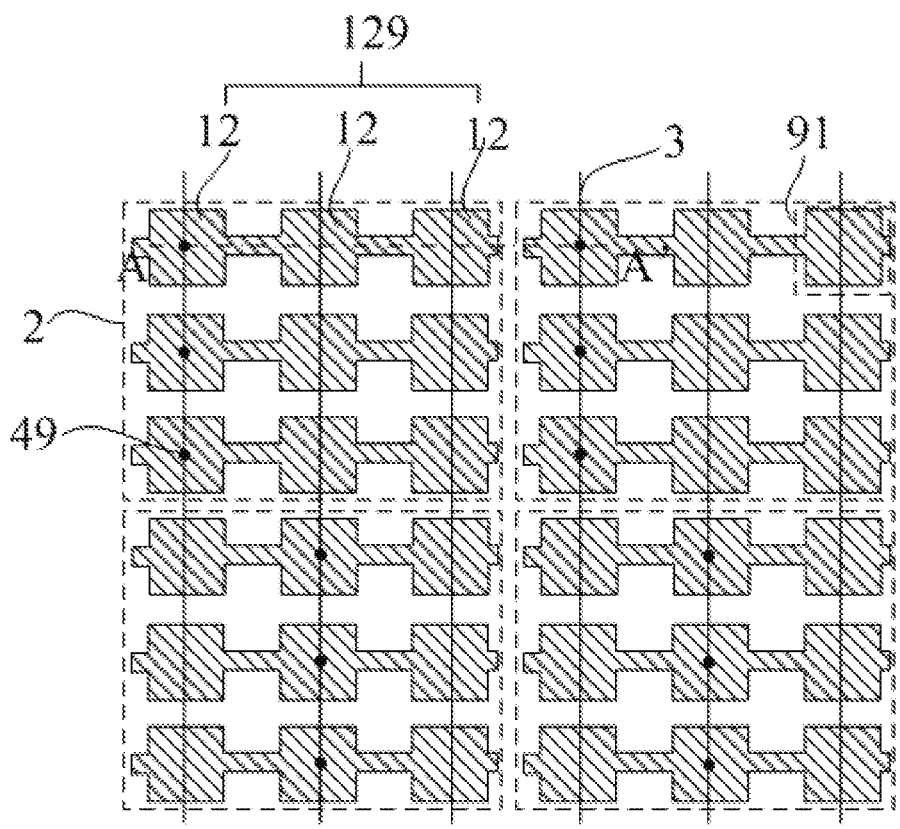
FIG. 4 is a schematic top view of a second electrode of a storage capacitor in a touch display substrate according to an embodiment of the present disclosure.

In FIGS. 2 and 4, in order to clearly show a structure of a second electrode of each storage capacitor, structures of the organic light emitting diode, a first electrode of the storage capacitor, a driving transistor and the like are not shown.

Figure 5:
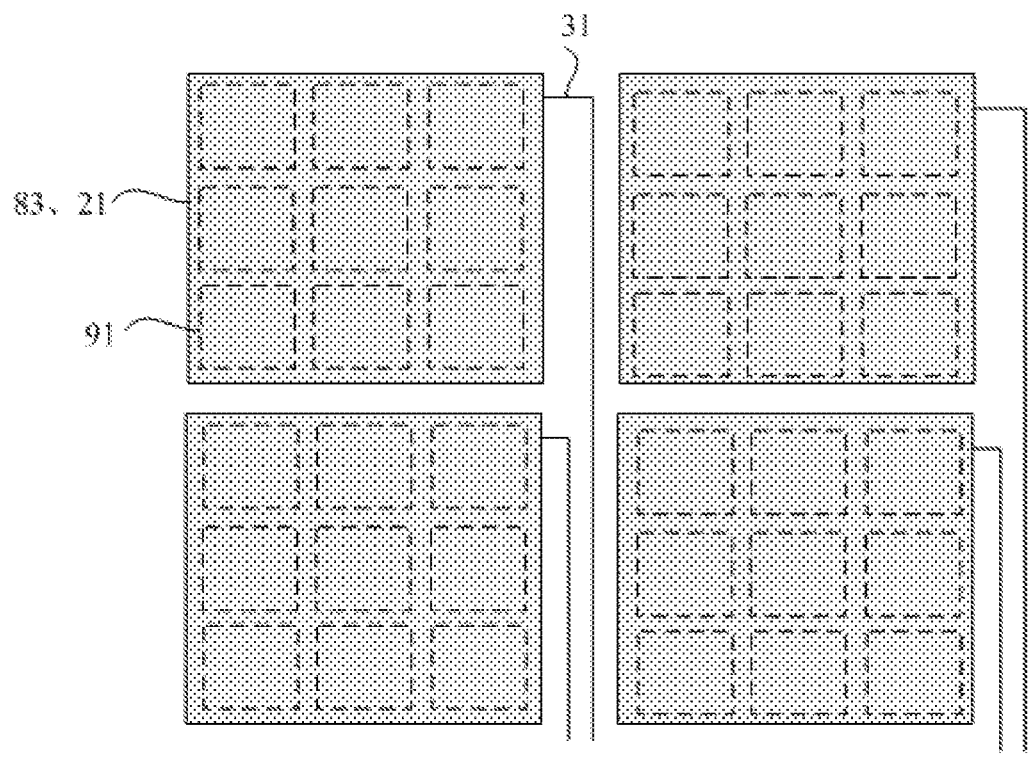
FIG. 5 is a schematic top view of a cathode of an organic light emitting diode in a touch display substrate according to an embodiment of the present disclosure.

It should be understood that, in FIG. 5, in order to clearly show a structure of a cathode of each organic light emitting diode, structures of a light emitting layer of the organic light emitting diode, an anode of the organic light emitting diode, the storage capacitor, the driving transistor and the like are not shown.

Figure 6:
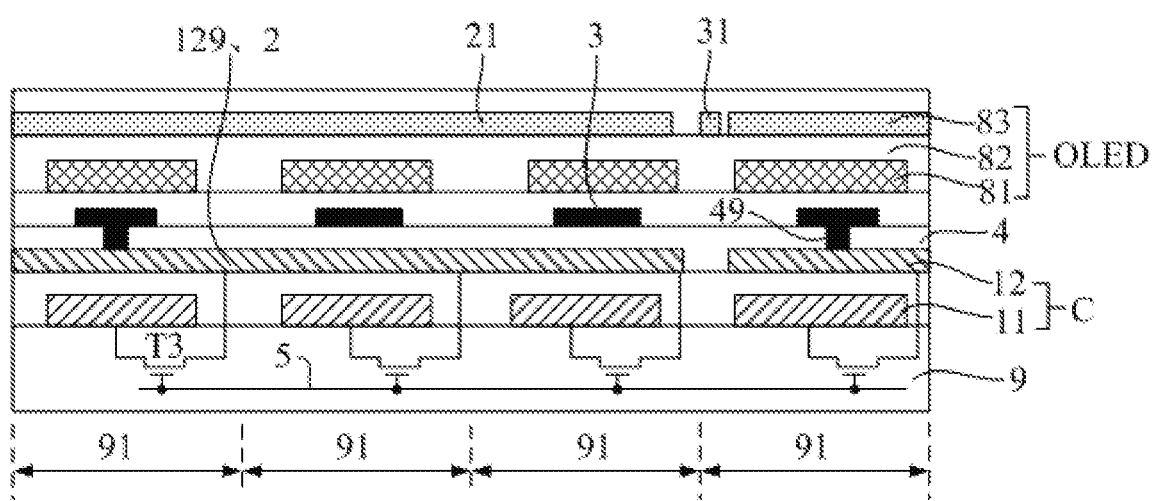
FIG. 6 is a schematic cross-sectional view of the touch display substrate of FIG. 4 taken along line AA'.
Figure 7:
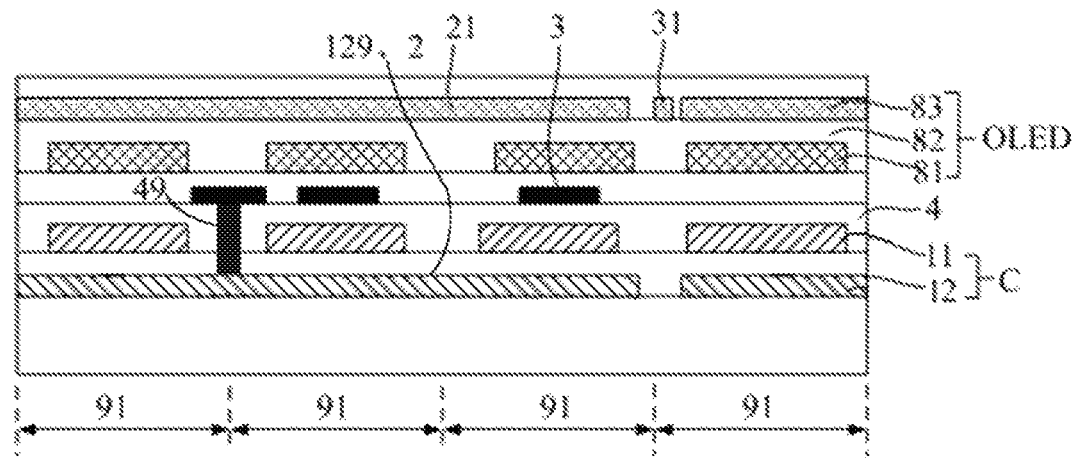
FIG. 7 is another schematic cross-sectional view of the touch display substrate of FIG. 4 taken along line AA'.

It should be understood that FIGS. 6 and 7 are cross-sectional views of the touch display substrate of FIG. 4 taken along line AN, and some of structures are not shown in FIG. 4 for clarity, but may be shown in FIGS. 6 and 7.

Figure 3:
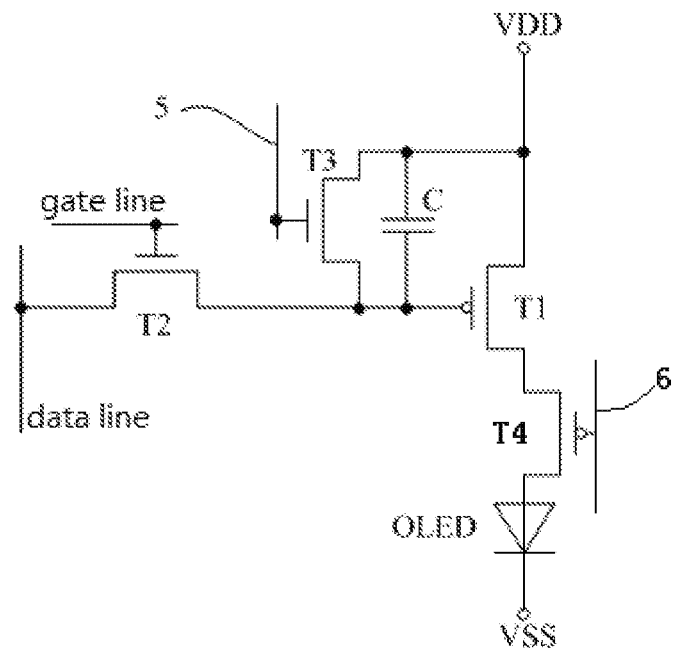
FIG. 3 is a circuit diagram of a pixel circuit according to an embodiment of the present disclosure.

As shown in FIGS. 3 to 7, an embodiment of the present disclosure provides a touch display substrate, which may include a plurality of sub-pixels 91, each of which may include a storage capacitor C, a driving transistor T1, a switching transistor T4, an organic light emitting diode (OLED), a first electrode 11 of the storage capacitor C is coupled to a gate electrode of the driving transistor T1, a second electrode 12 of the storage capacitor C is opposite to the first electrode 11 of the storage capacitor C, and as shown in FIG. 3, the second electrode 12 of the storage capacitor C may be coupled to a first electrode (e.g., a source electrode) of the driving transistor T1, a second electrode (e.g., a drain electrode) of the driving transistor T1 may be coupled to a first electrode (e.g., a source electrode) of the switching transistor T4, a second electrode (e.g., a drain electrode) of the switching transistor T4 may be coupled to a first electrode of the organic light emitting diode (OLED), and a gate electrode of the switching transistor T4 may be coupled to a switching control line 6.

In the embodiment, during a touch stage, a signal of the switch control line 6 may control the switching transistor T4 to be turned off, so that the second electrode of the driving transistor T1 is electrically decoupled from the organic light emitting diode (OLED), and the organic light emitting diode (OLED) does not emit light during the touch stage.

It should be understood that the switching transistor T4 and the switching control line 6 coupled to the gate electrode thereof may be replaced with other types of switches as needed, as long as it is possible to ensure normal display during a display stage and it is possible to ensure that the second electrode of the driving transistor T1 is electrically decoupled from the organic light emitting diode (OLED) during the touch stage so that the organic light emitting diode (OLED) does not emit light during the touch stage.

In the embodiment, the touch display substrate includes a plurality of touch electrodes 2 insulated from each other, and a plurality of touch lines 3 insulated from each other and respectively coupled to the touch electrodes 2, and each touch electrode 2 may be formed by the second electrode of the storage capacitor in at least one sub-pixel, for example, by the second electrode 12 of the storage capacitor C in one sub-pixel 91, or by electrically coupling second electrodes 12 of storage capacitors C in multiple adjacent ones of the sub-pixels 91. At least one insulating layer 4 is disposed between each touch electrode 2 and a corresponding touch line 3, for example, the insulating layer 4 may be provided with a via hole 49 therein, and each touch electrode 2 is coupled to the corresponding touch line 3 through the via hole 49 in the insulating layer 4, as shown in FIG. 6.

In the sub-pixel 91 of the touch display substrate of the embodiment, an organic light emitting diode (OLED) is used as the light emitting element, and thus the touch display substrate is an organic light emitting diode (OLED) touch display substrate. As shown in FIG. 3, in each sub-pixel 91, the driving transistor T1 of a 2T1C pixel circuit is coupled in series with the organic light emitting diode (OLED) through the switching transistor T4.

The gate electrode of the driving transistor T1 is coupled to a data line through the switching transistor T2, and the gate electrode of the switching transistor T2 is coupled to a gate line, so that a gate voltage of the driving transistor T1 can be controlled by a scan signal of the gate line and a data signal of the data line, that is, a current flowing through the driving transistor T1 and the switching transistor T4 and a light emitting brightness of the organic light emitting diode (OLED) are controlled. In order to maintain the gate voltage of the driving transistor T1 when the switching transistor T2 is turned off, the gate electrode of the driving transistor T1 is further coupled to one electrode (the first electrode 11) of the storage capacitor C, and the other electrode (the second electrode 12) of the storage capacitor C is coupled to a fixed voltage, for example, the second electrode 12 of the storage capacitor C is directly coupled to a first power supply voltage VDD. Alternatively, the second electrode 12 of the storage capacitor C may be indirectly coupled to the first power supply voltage VDD via a switching transistor. In addition, a second electrode of the organic light emitting diode (OLED) is coupled to a second power supply voltage VSS.

In the embodiment, the first electrode 11 of the storage capacitor C in each sub-pixel 91 is loaded with an independent voltage, so as shown in FIG. 6, first electrodes 11 of storage capacitors C in the sub-pixels 91 are separately disposed from each other, and the second electrode 12 of the storage capacitor C in each sub-pixel 91 is coupled to the fixed voltage, thus second electrodes 12 of the storage capacitors C in multiple sub-pixels 91 may be coupled into a whole.

As shown in FIG. 4, in the touch display substrate of the embodiment, the second electrode 12 of the storage capacitor C in each sub-pixel 91 may be used as one touch electrode 2 alone. Certainly, as general practical accuracy requirements, it is possible that the second electrodes 12 (e.g. each of which may have a size about 10 µm*10 µm) of the storage capacitors C in multiple sub-pixels 91 are electrically coupled together to form one touch electrode 2 (e.g. may have a size about 4 mm*4 mm), for example, the second electrodes 12 of the storage capacitors C in multiple adjacent sub-pixels 91 are electrically coupled together to form one touch electrode 2. Each touch electrode 2 is coupled to a driving chip through the corresponding touch line 3. For example, since the insulating layer 4 is disposed between the second electrode 12 of the storage capacitor C and the corresponding touch line 3, the second electrodes 12 of the storage capacitors C in the sub-pixels 91 may be coupled to each other by the touch line 3 through via holes 49 in the insulating layer 4.

In the touch display substrate of the embodiment, the second electrode 12 of the storage capacitor C is used as the touch electrode 2, and the insulating layer 4 is disposed between the second electrode 12 of the storage capacitor C and the corresponding touch line 3, thus the touch electrode 2 and the touch line 3 can be overlapped (and coupled through the via hole 49 in the insulating layer 4), and therefore an area occupied by the touch electrode 2 can be larger, and a small touch blind area exists. Meanwhile, since the touch electrodes 2 and the touch lines 3 may be made of material, such as metal, having good conductivity (e.g., copper, graphite, copper-tungsten alloy, silver-tungsten alloy or the like), therefore a small loss of touch signal may be resulted in and a size of product is not limited, for example, the touch display substrate of the embodiment may be used in a tablet computer or the like.

In some implementations, the touch lines 3 may extend in a column direction.

As shown in FIG. 4, the touch electrodes 2 are arranged in an array, each touch electrode 2 is formed by the second electrodes 12 of the storage capacitors C in m rows and n columns of sub-pixels 91, and m and n are integers greater than or equal to 2.

In each touch electrode 2, the second electrodes 12 of the storage capacitors C of the sub-pixels 91 in a same row are coupled into a whole to form a sub-electrode strip 129, and sub-electrode strips 129 in different rows are coupled to a same touch line 3.

It should be understood that the above "row(s)" and "column(s)" merely indicate two relative directions, and do not represent absolute directions in the product. In the drawings of the present application, the horizontal direction is the row direction, and the vertical direction is the column direction, but the row and the column are not particularly limited. For example, when the touch display substrate is used, it cannot be assumed that the rows are necessarily horizontal and the columns are necessarily vertical.

That is, the touch electrodes 2 may be arranged in an array, and each touch electrode 2 may correspond to the second electrodes 12 of the storage capacitors C in multiple adjacent sub-pixels 91.

As shown in FIG. 2, since lead lines such as gate lines may be disposed in a same layer as the storage capacitors C between the storage capacitors C of adjacent rows, the second electrodes 12 of the storage capacitors C in a same row are usually coupled together, and the second electrodes 12 of the storage capacitors C of different rows are spaced apart from each other.

As shown in FIG. 4, in the touch display substrate of the embodiment, the second electrodes 12 of the storage capacitors C in a same row in each touch electrode 2 are coupled into a whole to form the sub-electrode strip 129, and the second electrodes 12 of the storage capacitors C in a same row in different touch electrodes 2 are decoupled, and in order to electrically couple the sub-electrode strips 129 in each touch electrode 2, the sub-electrode strips 129 in each touch electrode 2 may be coupled to a same touch line 3 through via holes 49 in the insulating layer 4. The touch display substrate of the embodiment is obtained by modifying the related art as little as possible.

In some implementations, in each touch electrode 2, only the second electrodes 12 of the storage capacitors C in a portion of the sub-pixels 91 (as coupling sub-pixels) are coupled to the corresponding touch line 3, for example, in each touch electrode 2, one sub-pixel 91 in each row of sub-pixels 91 serves as the coupling sub-pixel, and the coupling sub-pixels in different rows are located in a same column. The coupling sub-pixels in any two touch electrodes 2 in a same column are located in different columns.

To facilitate wiring and coupling, each touch line 3 may be in a linear form and directly cross over one column of sub-pixels 91, thereby, as shown in FIG. 4, in each touch electrode 2, the second electrodes 12 of the storage capacitors C coupled to a same touch line 3 in different rows (i.e., different sub-electrode strips 129) are located in a same column, and correspondingly, in different touch electrodes 2 in a same column, the second electrodes 12 of the storage capacitors C coupled to the respective touch lines 3 are located in different columns.

In some implementations, the touch display substrate of the embodiment may further include a base substrate 9, and the organic light emitting diode (OLED) and the touch lines 3 are disposed on a side of the storage capacitor C away from the base substrate 9.

Generally, as shown in FIG. 6, each structure of the organic light emitting diode (OLED), such as an anode 81, a light emitting layer 82, and a cathode 83, is farther from the base substrate 9 than lead lines, capacitors, or the like. In order to avoid the touch lines 3 from affecting the touch signal, the touch lines 3 should also be farther from the base substrate 9 than the storage capacitor C.

In some implementations, the touch display substrate of the embodiment is a top emission touch display substrate.

That is, the touch display substrate of the embodiment may emit light from a side distal from the base substrate 9 for display. Since the touch electrode 2 is closer to the base substrate 9 than the organic light emitting diode (OLED), touch from the side of the base substrate 9 can be recognized, and thus a "back touch" performed on a "back side (non-display side)" of the touch display substrate can be recognized.

Compared with a touch on a front side (display surface) of the touch display substrate, the "back touch" cannot block sight lines, resulting in a good watch experience, moreover, even the touch causes abrasion of the touch display substrate, producing of fingerprints, etc. on the touch display substrate, the display of the touch display substrate cannot be obviously affected, and simultaneously, since the back side of the touch display substrate is not used for display, the touch electrodes 2, the touch lines 3, etc. cannot cause influences on the display of touch display substrate no matter how forms thereof are, which is favorable to a design of product, and in addition, can realize a turn of page, a game control, etc. by the back touch, functions of the product may be expanded and an improved performance may be achieved.

In some implementations, the touch display substrate of the embodiment is a flexible touch display substrate.

That is, the base substrate 9 of the touch display substrate of the embodiment may be made of flexible material. Generally, when a rigid touch display substrate is used in a display device, a housing or any other similar structure is required to be disposed on the back side (non-display surface) of the touch display substrate, but the flexible touch display substrate (particularly, a thin film flexible touch display substrate) may be in a form similar to "paper", and the back side of the flexible touch display substrate can be free of shielding, thus the back touch is easy to be implemented.

Certainly, it should be understood that even if the touch display substrate of the embodiment is the flexible touch display substrate, it is not limited to implement the back touch.

In some implementations, as shown in FIG. 6, the first electrode 11 of the storage capacitor C is disposed between the second electrode 12 of the storage capacitor C and the base substrate 9, the first electrode 11 and the second electrode 12 of each storage capacitor C may be coupled by a control transistor T3, and the gate electrode of each control transistor T3 may be electrically coupled to the control line 5, as shown in FIGS. 3 and 6.

In order to facilitate the coupling between the first electrode 11 of the storage capacitor C and the gate electrode of the corresponding driving transistor T1, the first electrode 11 of the storage capacitor C is disposed between the second electrode 12 of the storage capacitor C and the base substrate 9, and the touch may be performed from the side of the base substrate 9 (i.e., the back side of the touch display substrate), thus the first electrode 11 of the storage capacitor C may shield the touch signal. In view of this, as shown in FIGS. 3 and 6, the control transistor T3 may be added to couple the first electrode 11 and the second electrode 12 of the storage capacitor C in each sub-pixel 91, and on/off of the control transistor T3 may be controlled by the control line 5. When the touch display substrate performs the display function, the control transistor T3 may be turned off to ensure that two electrodes of the storage capacitor C are independent of each other, and when the touch display substrate performs the touch function, the control transistor T3 may be turned on to couple the two electrodes of the storage capacitor C into a whole to be used as the touch electrode 2, therefore the problem of shielding the touch signal is solved. The touch display substrate of the embodiment is obtained by modifying the related art as little as possible, and is easy to be realized.

It should be understood that the control transistor T3 and the control line 5 shown in FIG. 6 are only schematic representations of the coupling relationship between the two electrodes of the storage capacitor C, however the actual positions of the control transistor T3, the control line 5, and the two electrodes of the storage capacitor C may be different from those shown.

In some implementations, as shown in FIG. 7, the second electrode 12 of the storage capacitor C may be disposed closer to the base substrate 9 than the first electrode 11 of the storage capacitor C.

As shown in FIG. 7, the second electrode 12 of the storage capacitor C may be disposed closer to the base substrate 9 than the first electrode 11 of the storage capacitor C, and compared to the embodiment shown in FIG. 6, the second electrode 12 may be directly used as the touch electrode 2 without additionally adding the control transistor 3. In addition, the touch line 3 may be coupled to the second electrode 12 of the storage capacitor C through the via hole 49, penetrating through the insulation layer 4, between the first electrodes 11 of the storage capacitors C. In the embodiment, the touch may still be performed from the side of the base substrate 9 (i.e., the back side of the touch display substrate), and in such case, the first electrode 11 of the storage capacitor C does not shield the touch signal.

It should be noted that, in the case where an area of the second electrode 12 of the storage capacitor C exceeds an area of the first electrode 11 of the storage capacitor C enough for touch, even if the second electrode 12 of the storage capacitor C is farther from the base substrate 9 than the first electrode 11 of the storage capacitor C, it is not necessary to additionally provide the control transistor T3.

In some implementations, the organic light emitting diode (OLED) may include a first electrode (e.g., anode 81), the light emitting layer 82, and a second electrode (e.g., cathode 83) disposed in sequence in a direction away from the base substrate 9.

In some implementations, the touch display substrate of the embodiment may further include a plurality of auxiliary touch electrodes 21 which are mutually insulated and a plurality of auxiliary touch lines 31 which are mutually insulated, as shown in FIG. 6. Each of the auxiliary touch electrodes 21 may be formed by coupling second electrodes of organic light emitting diodes (OLEDs) in multiple adjacent sub-pixels 91, and each of the auxiliary touch electrodes 21 may be coupled to a corresponding auxiliary touch line 31. It should be understood that since the cross-sectional view shown in FIG. 6 is not taken along the coupling position of the auxiliary touch line 31 and the auxiliary touch electrode 21, the auxiliary touch line 31 and the auxiliary touch electrode 21 shown in FIG. 6 are separated from each other, but the coupling relationship of the auxiliary touch line 31 and the auxiliary touch electrode 21 can be seen in FIG. 5, for example, each auxiliary touch electrode 21 may be formed by coupling second electrodes of organic light emitting diodes (OLEDs) in multiple adjacent sub-pixels 91 into a whole, and each auxiliary touch electrode 21 may be electrically coupled to the corresponding auxiliary touch line 31 by the second electrode of the organic light emitting diode (OLED) in one sub-pixel 91.

In some implementations, the first electrode of the organic light emitting diode (OLED) may be the anode 81, and the second electrode of the organic light emitting diode (OLED) may be the cathode 83.

Since the organic light emitting diode (OLED) is farther from the base substrate 9 than the touch electrode 2, while the electrode of the storage capacitor C is used as the touch electrode to realize touch, as shown in FIGS. 5 and 6, the electrode (e.g., the second electrode) of the organic light emitting diode (OLED) farther from the base substrate 9 may be used as the auxiliary touch electrode to realize touch, that is, the second electrodes of the organic light emitting diodes (OLED) in multiple adjacent sub-pixels 91 may be coupled together to form the auxiliary touch electrode 21, and each auxiliary touch electrode 21 is coupled to the corresponding auxiliary touch line 31. In the embodiment, the cathode 83 of the organic light emitting diode (OLED) is farther from the base substrate 9 than the anode 81 of the organic light emitting diode (OLED), thus the cathode 83 of the organic light emitting diode (OLED) may be used as the auxiliary touch electrode 21, which is easy to implement without a great change compared to the related art.

Therefore, the touch display substrate of the embodiment can realize the touch function on the side of the base substrate 9 by forming the electrode of the storage capacitor. C as the touch electrode 2, and can realize the touch function on the side away from the base substrate 9 by forming the second electrode (e.g., the cathode 83) of the organic light emitting diode (OLED) as the auxiliary touch electrode 21, thus a "double-sided touch function" can be realized, and the product has more functions.

In some implementations, as shown in FIG. 6, the auxiliary touch electrode 21 and the auxiliary touch line 31 may be disposed in a same layer.

As shown in FIG. 6, since the second electrode (e.g., cathode 83) of the organic light emitting diode (OLED) is farther away from the base substrate 9 than the light emitting layer 82, and the light emitting layer 82 is more difficult to be provided with a via hole, etc., the auxiliary touch electrode 21 (e.g., cathode 83) and the auxiliary touch line 31 may be disposed in a same layer, so as to avoid a large modification compared to the related art, and the implementation is easy.

It should be understood that, in the touch display substrate of the embodiment, a gate line, a data line, other transistors of the pixel circuit, other capacitors of the pixel circuit, and other structures may be provided, and these structures may be disposed in the same layers as some of the above-mentioned structures, and will not be described in detail herein.

An embodiment of the present disclosure further provides a method for driving the touch display substrate as above, and the method may include a display stage and a touch stage.

During the display stage, a first voltage signal is provided to each touch line 3 for display.

During the touch stage, a first touch signal is provided to each touch line 3, and a first feedback signal fed back from each touch line 3 is received, and the switching transistor T4 is controlled to electrically decouple the second electrode of the driving transistor T1 from the organic light emitting diode (OLED).

For example, a plurality of touch electrodes 2 and a plurality of touch lines 3 respectively coupled to the touch electrodes 2 may be disposed in the touch display substrate, an insulating layer 4 may be disposed between each touch electrode 2 and the corresponding touch line 3, and each touch electrode 2 is formed by the second electrode 12 of the storage capacitor C in at least one sub-pixel 91.

Figure 8:
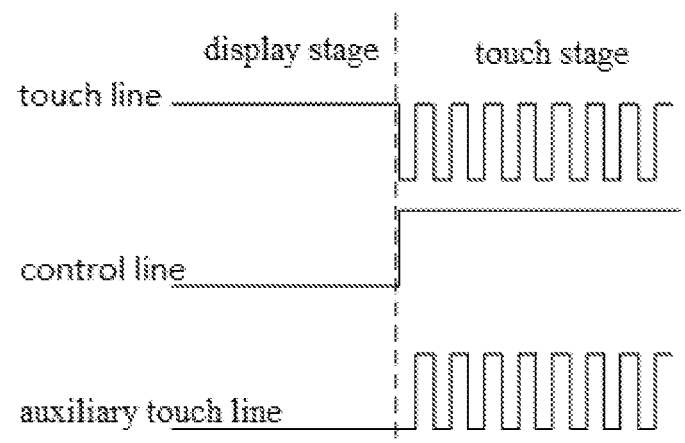
FIG. 8 is a driving timing diagram of a touch display substrate according to an embodiment of the disclosure.

Since the touch electrode 2 in the touch display substrate is also the second electrode 12 of the storage capacitor C, as shown in FIG. 8, when the touch display substrate implements the display function, the first voltage signal (which may be a fixed voltage, such as a first power supply voltage VDD, and may be a high level) for display may be provided to the second electrode 12 of the storage capacitor C through the touch line 3, and when the touch display substrate implements the touch function, the touch signal may be provided to the second electrode 12 of the storage capacitor C through the touch line 3 and the signal fed back therefrom may be received.

Certainly, since the touch electrodes 2 are not overlapped, a "self-capacitance" touch is essentially realized, and thus the touch signal provided to the touch electrodes 2 should be in a form used for the self-capacitance touch, such as a high-frequency (e.g., about 100 KHz) square wave oscillation signal.

In some implementations, for the touch display substrate having the control transistor T3, for example, the touch electrode 2 is formed by electrically coupling second electrodes 12 of storage capacitors C in multiple adjacent sub-pixels 91, the first electrode 11 of the storage capacitor C is disposed closer to the base substrate 9 than the second electrode 12 of the storage capacitor C, the first electrode 11 and the second electrode 12 of the storage capacitor C may be coupled by the control transistor T3, and the gate electrode of each control transistor T3 is electrically coupled to the control line 5, in such case, during the display stage, a turn-off signal (i.e., a signal capable of turning off the control transistor T3) is also provided to the control line 5 to turn off the control transistor T3, and during the touch stage, a turn-on signal (i.e., a signal capable of turning on the control transistor T3) is also provided to the control line 5 to turn on the control transistor T3.

Obviously, when the control transistor T3 is used, the control transistor T3 is controlled to be turned off by the control line 5 during the display stage to avoid conduction of the two electrodes of the storage capacitor C, and the control transistor T3 is controlled to be turned on by the control line 5 during the touch stage to enable the two electrodes of the storage capacitor C to be mutually communicated to serve as the touch electrode 2.

In some implementations, the second electrode of the organic light emitting diode (OLED) in the touch display substrate is used as the auxiliary touch electrode 21, for example, the touch display substrate has a plurality of auxiliary touch electrodes 21 which are mutually insulated and a plurality of auxiliary touch lines 31 which are mutually insulated, each auxiliary touch electrode 21 is formed by coupling the second electrodes of the organic light emitting diodes in multiple adjacent sub-pixels 91 into a whole, and each auxiliary touch electrode 21 is coupled to a corresponding auxiliary touch line 31, in this case, a second voltage signal is further provided to each auxiliary touch line 31 for display during the display stage, a second touch signal is further provided to each auxiliary touch line 31 during the touch stage, and a second feedback signal fed back by each auxiliary touch line 31 is received.

When the second electrode (e.g., the cathode 83) of the organic light emitting diode (OLED) is used as the auxiliary touch electrode 21, the second voltage signal (e.g., a second power supply voltage VSS, which may be a low level) for display is applied to the second electrode of the organic light emitting diode (OLED) through the auxiliary touch line 31 during the display stage, and the touch signal is applied to the second electrode of the organic light emitting diode (OLED) and the corresponding feedback is received during the touch stage, so as to implement the touch function.

In some implementations, the first touch signal and the second touch signal are provided simultaneously.

Obviously, a normal display cannot be performed during the touch stage, that is, the organic light emitting diode (OLED) does not emit light during the touch stage, but a duration of the touch stage is short and human's eyes may not notice that the organic light emitting diode (OLED) does not emit light during the touch stage, so the duration of the touch stage should be as short as possible, and therefore both the touch electrode 2 and the auxiliary touch electrode 21 may be used for the touch function, that is, the first touch signal and the second touch signal are provided simultaneously, so that the duration of the touch stage is as short as possible.

In some implementations, the first touch signal and the second touch signal may be synchronized.

Theoretically, the first touch signal and the second touch signal may not necessarily be related, but in order to minimize mutual influences between the touch electrode 2 and the auxiliary touch electrode 21, a voltage difference between the first touch signal and the second touch signal should be kept as constant as possible, that is, the first touch signal and the second touch signal may be synchronized (i.e., waveforms, frequencies, phases and amplitudes of the first touch signal and the second touch signal are all the same) so as to keep the voltage difference between the first touch signal and the second touch signal constant.

In some implementations, for the touch display substrate without the auxiliary touch electrode, the organic light emitting diode (OLED) may include a first electrode, a light emitting layer, and a second electrode which are sequentially disposed, the touch electrode 2 may be formed by electrically coupling the second electrodes of the storage capacitors C in multiple adjacent sub-pixels 91, the first electrode of the storage capacitor C is coupled to the first electrode of the organic light emitting diode (OLED) through the gate electrode of the driving transistor T1 and the switching transistor T4, and the second electrode of the storage capacitor C is coupled to the first electrode of the organic light emitting diode (OLED) through the first electrode of the driving transistor T1 and the switching transistor T4, in such case, during the touch stage, an auxiliary signal being synchronous with the first touch signal may be provided to the second electrode of the organic light emitting diode (OLED) while the first touch signal is provided to each touch line 3.

That is, when the second electrode (e.g., cathode 83) of the organic light emitting diode (OLED) is not used for the touch function, if the second electrode of the storage capacitor C is coupled to the first electrode (e.g. the anode 81) of the organic light emitting diode (OLED) (through the first electrode of the driving transistor T1 and the switching transistor T4), during the touch stage, an auxiliary signal synchronized with the first touch signal may be provided to the second electrode (e.g., cathode 83) of the organic light emitting diode (OLED), that is, the auxiliary signal and the first touch signal have the same waveform, frequency, phase and amplitude, the first touch signal is provided to the second electrode of the storage capacitor C through the touch line 3, this is because the second electrode (e.g., cathode 83) of the organic light emitting diode (OLED) and the second electrode of the storage capacitor C are actually coupled to two power supply voltages VSS and VDD for supplying power to the organic light emitting diode (OLED), respectively, thus they are synchronous and can ensure that a voltage difference between them does not change.

An embodiment of the present disclosure further provides a display device, which may include the touch display substrate described above.

That is, the touch display substrate of the embodiment of the present disclosure may be combined with other components to form the display device with complete display and touch functions.

Specifically, the display device may be any product or component having a display function, such as an organic light emitting diode (OLED) display panel, an electronic paper, a mobile phone, a tablet computer, a television, a display, a notebook computer, a digital photo frame, and a navigator.

It should be understood that, the above embodiments and implementations are merely exemplary embodiments and implementations for explaining principle of the present disclosure, but the present disclosure is not limited thereto. Various modifications and variants may be made by those ordinary skilled in the art within the spirit and essence of the present disclosure, these modifications and variants fall into the protection scope of the present disclosure.

The invention claimed is:

1. A touch display substrate, comprising a plurality of sub-pixels, each of the sub-pixels comprises a storage capacitor, a driving transistor, a switching element and a light emitting element, a first electrode of the storage capacitor is coupled to a gate electrode of the driving transistor, a second electrode of the storage capacitor is opposite to the first electrode of the storage capacitor and is coupled to a first electrode of the driving transistor, a second electrode of the driving transistor, the switching element and the light emitting element are sequentially coupled in series, the touch display substrate is also provided with a plurality of touch electrodes which are mutually insulated and a plurality of touch lines, which are mutually insulated, respectively coupled to the touch electrodes, an insulating layer is provided between each of the touch electrodes and a corresponding one of the touch lines, each of the touch electrodes is coupled to the corresponding one of the touch lines through a via hole in the insulating layer, and each of the touch electrodes is formed by the second electrode of the storage capacitor in at least one of the sub-pixels, during a touch stage, the switching element is configured to decouple an electrical coupling between the second electrode of the driving transistor and the light emitting element, the touch display substrate further comprises:

a base substrate, wherein the storage capacitor, the touch lines and the light emitting element are all arranged on the base substrate, and the light emitting element and the touch lines are arranged on a side, distal from the base substrate, of the storage capacitor.

2. The touch display substrate of claim 1, wherein the touch electrode is formed by electrically coupling second electrodes of storage capacitors in multiple adjacent ones of the sub-pixels.

3. The touch display substrate of claim 1, wherein the touch lines extend along a column direction, the touch electrodes are arranged in an array, each of the touch electrodes is formed by electrically coupling second electrodes of storage capacitors in m rows and n columns of ones of the sub-pixels, m and n are integers larger than or equal to 2, in each of the touch electrodes, the second electrodes of the storage capacitors of the sub-pixels in a same row are coupled into a whole to form a sub-electrode strip, and sub-electrode strips in different rows are coupled to a same one of the touch lines.

4. The touch display substrate of claim 3, wherein in each of the touch electrodes, a portion of the sub-pixels are used as coupling sub-pixels, and the second electrodes of the storage capacitors in the portion of the sub-pixels are coupled to the corresponding one of the touch lines, in each touch electrode, one of the sub-pixels in each row is used as the coupling sub-pixel, and the coupling sub-pixels in different rows are located in a same column, the coupling sub-pixels in any two of the touch electrodes in a same column are located in different columns.

5. The touch display substrate of claim 1, wherein the touch display substrate is a flexible touch display substrate.

6. The touch display substrate of claim 1, wherein the touch display substrate is a top emission touch display substrate.

7. The touch display substrate of claim 1, wherein the first electrode of the storage capacitor is arranged between the second electrode of the storage capacitor and the base substrate;

the first electrode and the second electrode of the storage capacitor are coupled through a control transistor, and a gate electrode of the control transistor is electrically coupled to a control line.

8. The touch display substrate of claim 1, wherein the second electrode of the storage capacitor is disposed between the first electrode of the storage capacitor and the base substrate.

9. The touch display substrate of claim 1, wherein the light emitting element is an organic light emitting diode comprising a first electrode, a light emitting layer and a second electrode which are arranged in sequence along a direction away from the base substrate, the touch display substrate is further provided with a plurality of auxiliary touch electrodes which are mutually insulated and a plurality of auxiliary touch lines which are mutually insulated, each of the auxiliary touch electrodes is formed by coupling second electrodes of organic light emitting diodes in multiple adjacent ones of the sub-pixels into a whole, and each of the auxiliary touch electrodes is coupled to a corresponding one of the auxiliary touch lines.

10. The touch display substrate of claim 9, wherein the auxiliary touch electrodes and the auxiliary touch lines are arranged in a same layer.

11. The touch display substrate of claim 9, wherein the first electrode of the organic light emitting diode is an anode, and the second electrode of the organic light emitting diode is a cathode.

12. The touch display substrate of claim 1, wherein the touch electrodes and the touch lines are made of metal material.

13. A display device, comprising: the touch display substrate of claim 1.

14. A method for driving a touch display substrate, the touch display substrate comprises a storage capacitor, a driving transistor, a switching element and a light emitting element, a first electrode of the storage capacitor is coupled to a gate electrode of the driving transistor, a second electrode of the storage capacitor is opposite to the first electrode of the storage capacitor and is coupled to a first electrode of the driving transistor, and a second electrode of the driving transistor, the switching element and the light emitting element are sequentially coupled in series, the touch display substrate is further provided with a plurality of touch electrodes which are mutually insulated and a plurality of touch lines, which are mutually insulated, respectively coupled to the touch electrodes, an insulating layer is provided between each of the touch electrodes and a corresponding one of the touch lines, each of the touch electrodes is coupled to the corresponding one of the touch lines through a via hole in the insulating layer, and each of the touch electrodes is formed by the second electrode of the storage capacitor in at least one sub-pixel, the method comprises:

during a display stage, providing a first voltage signal to each of the touch lines for display;

during a touch stage, providing a first touch signal to each of the touch lines and receiving a first feedback signal fed back by each of the touch lines, wherein during the touch stage, the switching element is controlled to decouple an electrical coupling between the second electrode of the driving transistor and the light emitting element, wherein each of the touch electrodes is formed by electrically coupling second electrodes of storage capacitors in multiple adjacent sub-pixels, each of the storage capacitors is arranged on a base substrate, the first electrode of each of the storage capacitors, the first electrode and the second electrode of each of the storage capacitors are coupled through a control transistor, and a gate electrode of the control transistor is electrically coupled to a control line, the method comprises:

during the display stage, providing a turn-off signal to the control line to control the control transistor to be turned off;

during the touch stage, providing a turn-on signal to the control line to control the control transistor to be turned on.

15. The method of claim 14, wherein
the light emitting element is an organic light emitting diode, the touch display substrate further comprises a plurality of auxiliary touch electrodes which are mutually insulated and a plurality of auxiliary touch lines which are mutually insulated, each of the auxiliary touch electrodes is formed by coupling second electrodes of organic light emitting diodes in multiple adjacent sub-pixels, and each of the auxiliary touch electrodes is coupled to a corresponding one of the auxiliary touch lines, the method further comprises:

during the display stage, providing a second voltage signal to each of the auxiliary touch lines for display;

during the touch stage, providing a second touch signal to each of the auxiliary touch lines, and receiving a second feedback signal fed back by each of the auxiliary touch lines.

16. The method of claim 15, wherein
the first touch signal and the second touch signal are provided simultaneously.

17. The method of claim 16, wherein
the first touch signal is synchronous with the second touch signal.

18. A method for driving a touch display substrate, the touch display substrate comprises a storage capacitor, a driving transistor, a switching element and a light emitting element, a first electrode of the storage capacitor is coupled to a gate electrode of the driving transistor, a second electrode of the storage capacitor is opposite to the first electrode of the storage capacitor and is coupled to a first electrode of the driving transistor, and a second electrode of the driving transistor, the switching element and the light emitting element are sequentially coupled in series, the touch display substrate is further provided with a plurality of touch electrodes which are mutually insulated and a plurality of touch lines, which are mutually insulated, respectively coupled to the touch electrodes, an insulating layer is provided between each of the touch electrodes and a corresponding one of the touch lines, each of the touch electrodes is coupled to the corresponding one of the touch lines through a via hole in the insulating layer, and each of the touch electrodes is formed by the second electrode of the storage capacitor in at least one sub-pixel, the method comprises:

during a touch stage, providing a first touch signal to each of the touch lines and receiving a first feedback signal fed back by each of the touch lines, wherein during the touch stage, the switching element is controlled to decouple an electrical coupling between the second electrode of the driving transistor and the light emitting element, wherein each of the touch electrodes is formed by electrically coupling second electrodes of storage capacitors in multiple adjacent sub-pixels, the light emitting element is an organic light emitting diode, the organic light emitting diode comprises a first electrode, a light emitting layer and a second electrode which are sequentially arranged, and the second electrode of the storage capacitor is coupled to the first electrode of the organic light emitting diode through the first electrode of the driving transistor, the method comprises:

during the touch stage, simultaneously providing the first touch signal to each of the touch lines and a synchronous auxiliary signal to the second electrode of the organic light emitting diode.

* * * * *